US007173986B2

(12) United States Patent
Wu

(10) Patent No.: US 7,173,986 B2
(45) Date of Patent: Feb. 6, 2007

(54) NONLINEAR OVERLAP METHOD FOR TIME SCALING

(75) Inventor: Gin-Der Wu, Taipei (TW)

(73) Assignee: ALI Corporation, Taipei (TW)

( * ) Notice: Subject to any disclaimer, the term of this patent is extended or adjusted under 35 U.S.C. 154(b) by 725 days.

(21) Appl. No.: 10/605,518

(22) Filed: Oct. 5, 2003

(65) Prior Publication Data

US 2005/0025263 A1 Feb. 3, 2005

(30) Foreign Application Priority Data

Jul. 23, 2003 (TW) .............................. 92120145 A

(51) Int. Cl.
*H03D 1/00* (2006.01)
*H04L 27/06* (2006.01)
*G10L 19/00* (2006.01)
*G10L 13/00* (2006.01)

(52) U.S. Cl. ........................ 375/343; 704/218; 704/258

(58) Field of Classification Search ........ 375/142–144, 375/148–153, 343; 370/484; 379/67.1; 704/218, 220, 237, 258
See application file for complete search history.

(56) References Cited

U.S. PATENT DOCUMENTS

| | | | | |
|---|---|---|---|---|
| 4,868,867 | A * | 9/1989 | Davidson et al. | 704/200.1 |
| 5,845,247 | A * | 12/1998 | Miyasaka | 704/267 |
| 6,484,137 | B1 * | 11/2002 | Taniguchi et al. | 704/211 |
| 2005/0273321 | A1 * | 12/2005 | Choi | 704/207 |

* cited by examiner

*Primary Examiner*—Don N. Vo
(74) *Attorney, Agent, or Firm*—Winston Hsu

(57) ABSTRACT

A nonlinear overlap method for time scaling to synthesize an $S_1[n]$ and an $S_2[n]$ into an $S_3[n]$ is disclosed. The $S_1[n]$ and the $S_2[n]$ having $N_1$ and $N_2$ signals respectively. The non-linear overlap method includes the following steps: (a) delaying the $S_2[n]$ by a predetermined number and forming an $S_5[n]$, (b) establishing a correlogram of a cross-correlation function of the $S_1[n]$ and $S_5[n]$, and (c) setting $S_3[n]$ as a number of $S_1[n]$ when 0<=n<; as a number formed by overlap-adding the $S_1[n]$ and an $S_4[n]$ in a weighting manner when (the predetermined number+the maximum index+the first threshold)<=n<($N_1$−a second threshold); and as a number of $S_4$ wherein the first and second thresholds are not equal to zero at the same time, and the $S_4[n]$ is formed by delaying the $S_5[n]$ by the maximum index.

19 Claims, 4 Drawing Sheets

NONLINEAR OVERLAP METHOD FOR TIME SCALING

BACKGROUND OF INVENTION

1. Field of the Invention

The present invention relates to a signal-synthesizing method, and more particularly, to a nonlinear overlap method for time scaling.

2. Description of the Prior Art

Due to the dramatic progress in electronic technologies, an AV player such as a Karaoke can provide more and more amazing functions, such as audio clean-up, dynamic repositioning of enhanced audio and music (DREAM), and time scaling. Time scaling (also called time stretching, time compression/expansion, or time correction) is a function to elongate or shorten an audio signal while keeping the pitch of the audio signal approximately unchanged. In short, time scaling only adjusts the tempo of an audio signal.

In general, an AV player performs time scaling with one of the three following methods: Phase Vocoder, Minimum Perceived Loss Time Expansion/Compression (MPEX), and Time Domain Harmonic Scaling (TDHS). Phase Vocoder transforms an audio signal into a complex Fourier representation signal with Short Time Fourier Transform (STFT) and further transforms the complex Fourier representation signal back to a time scaled audio signal corresponding to the original audio signal with interpolation techniques and iSTFT (inverse STFT). MPEX is a method researched and developed by Prosoniq for simulating characteristics of human hearing, similar to an artificial neural network. MPEX records audio signals received for a predetermined period and tries to "learn" the audio signals, so as to either elongate or shorten the audio signals. TDHS is one of the most popular methods for time scaling. TDHS first establishes an autocorrelogram of a first audio signal, the autocorrelogram consisting of a plurality of magnitudes, and then delays the first audio signal by a maximum index corresponding to a maximum magnitude, a largest magnitude among all of the magnitudes of the autocorrelogram, to form a second audio signal, and lastly synchronizes and overlap-adds (SOLA) the first audio signal to the second audio signal to form a third audio signal longer than the first audio signal.

In a computer system, the autocorrelogram is usually established by a digital signal processing (DSP) chip designed to manage complex mathematic calculation such as convolution and fast Fourier transform (FFT). However, a process by the DSP chip to synthesize the third audio signal from the first and second audio signals is tedious and sometimes unnecessary.

SUMMARY OF INVENTION

It is therefore a primary objective of the claimed invention to provide a nonlinear overlap method for time scaling to efficiently synthesize a third audio signal from a first audio signal and a second audio signal without sacrificing the quality of the third audio signal dramatically.

According to the claimed invention, the nonlinear overlap method for time scaling to synthesize an $S_3[n]$ signal from an $S_1[n]$ signal and an $S_2[n]$ signal, the $S_1[n]$ signal having $N_1$ elements and the $S_2[n]$ signal having $N_2$ elements, comprises:

(a)delaying the $S_2[n]$ signal by a predetermined number of elements and forming an $S_5[n]$ signal;

(b)establishing a cross-correlogram of a cross-correlation function of the $S_1[n]$ signal and the $S_5[n]$ signal, the cross-correlogram including a plurality of magnitudes, each of the magnitudes corresponding to an index; and (c)setting the $S_3[n]$ signal as values of the elements of:

$S_1[n]$, where 0<=n<(the predetermined number+a first threshold value+a maximum index), the maximum index corresponding to a largest magnitude among all of the magnitudes of the cross correlogram;

$S_1[n]$ weights and adds to an $S_4[n]$ signal that lags the $S_5[n]$ signal by the maximum index, where (the predetermined number+the first threshold value+the maximum index)<=n<($N_1$−a second threshold value); and $S_4$[n (the predetermined number+the maximum index)], where ($N_1$−the second threshold value)<=n<=($N_2$+predetermined number+the maximum index);

wherein the first and second threshold values are not equal to zero at the same time.

It is an advantage of the claimed invention that the method calculates values between the first threshold and the second threshold instead of all values of the overlapped signal from A to Z to save time for a DSP chip to synthesize the $S_3[n]$ signal from the $S_1[n]$ and $S_2[n]$ signals and promote a computer where the DSP chip is installed in.

These and other objectives of the claimed invention will no doubt become obvious to those of ordinary skill in the art after reading the following detailed description of the preferred embodiment that is illustrated in the various figures and drawings.

DETAILED DESCRIPTION

After establishing an autocorrelogram corresponding to a first audio signal and a second audio signal (or a signal lagging the first audio signal by a predetermined number), the autocorrelogram consisting of a plurality of magnitudes, a method 100 of the preferred embodiment of the present invention determines a maximum index corresponding to a maximum magnitude, a largest magnitude in the autocorrelogram, and calculates a third audio signal according to the first audio signal, the second audio signal, the maximum index, a first threshold and a second threshold. In detail, in order to save time for a digital signal processing (DSP) chip to synthesize the third audio signal from the first and second audio signals, the method 100, having determined the maximum index and delaying the second audio signal by the maximum index, does not weight and add all of an overlapped signal mixed with the first audio signal and the second audio signal as well to the second audio signal but weights and adds part (a region between the first threshold and the second threshold) of the overlapped signal to the second audio signal instead and forms the third audio signal.

Figure 1:
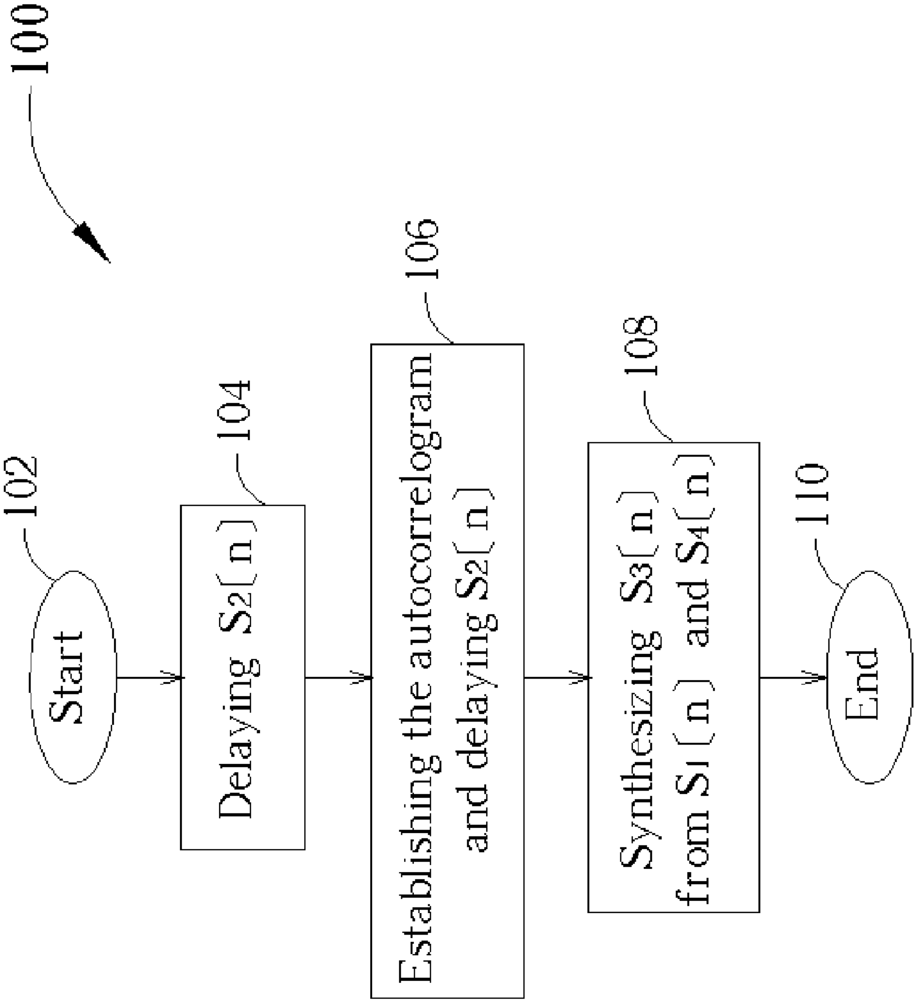
FIG. 1 is a flow chart of a method according to the present invention.

Please refer to FIG. 1, which is a flow chart of a method 100 of the preferred embodiment according to the present invention. The method 100 comprises the following steps:

Step 102: Start;

(An $S_3[n]$ signal is to be synthesized from an $S_1[n]$ signal and an $S_2[n]$ signal. For simplicity, the $S_1[n]$ signal and $S_2[n]$ signals are defined to contain $N_1$ and $N_2$ signals respectively.)

Step 104: Delaying the $S_2[n]$ signal by a predetermined number Δ and forming an $S_5[n]$ signal;

(In order to prevent run-in from occurring in a process a pickup of an A/V player reads the $S_3[n]$ signal, the method 100 delays the $S_2[n]$ signal by the predetermined number Δ then determines an maximum index $\tau_{max}$ crucial for the process to synthesize the $S_3[n]$ signal from the $S_1[n]$ signal and the $S_2[n]$ signal. In the preferred embodiment, the predetermined number Δ is equal to [N/3].)

Step 106: Establishing an autocorrelogram of the $S_1[n]$ and $S_5[n]$ signals and delaying the $S_5[n]$ signal to form an $S_4[n]$ signal according to the maximum index $\tau_{max}$ corresponding to a maximum magnitude in the autocorrelogram;

(The autocorrelogram comprises a plurality of magnitudes of a cross-correlation function, each of the magnitudes corresponding to a distinct index.)

Step 108: Synthesizing the $S_3[n]$ signal from the $S_1[n]$ signal and the $S_4[n]$signal;

(The $S_3[n]$ signal is equal to the $S_1[n]$ signal, where 0<=n<(the predetermined number Δ+a first threshold value $th_1$+the maximum index $\tau_{max}$);

the $S_1[n]$ signal weights and adds to the $S_4[n]$ signal, where (the predetermined number Δ+the first threshold value $th_1$+the maximum index $\tau_{max}$)<=n<($N_1$ a second threshold value $th_2$); and the $S_4[n]$ (the predetermined number Δ+the maximum index $\tau_{max}$)] signal, where ($N_1$−the second threshold value $th_2$)<=n <=($N_2$+the predetermined number Δ+the maximum index $\tau_{max}$);

wherein the first threshold value th and second threshold value $th_2$ are not equal to zero at the same time.)

Step 110: End.

Figure 2:
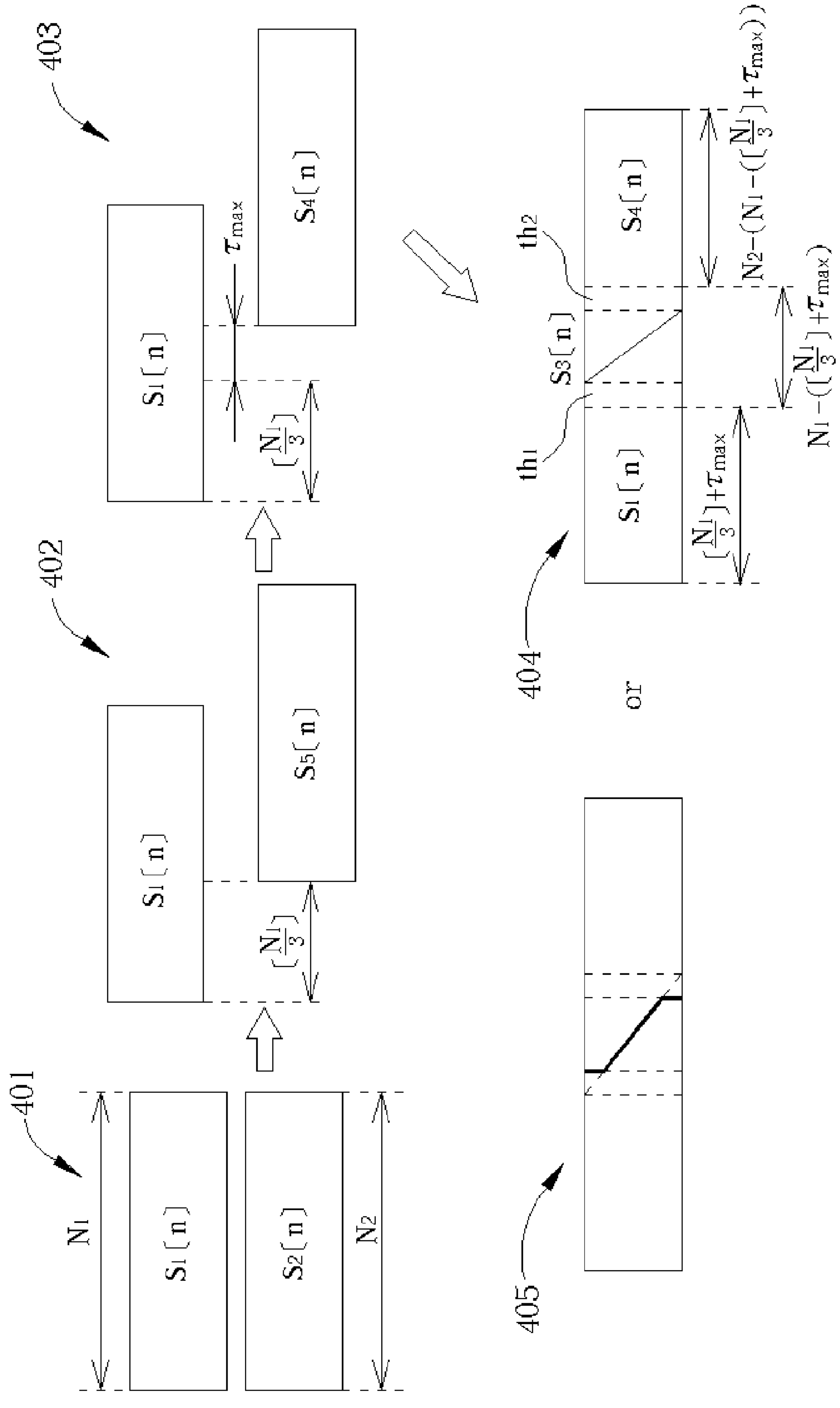
FIG. 2 is a schematic diagram demonstrating how the method synthesizes an $S_3[n]$ signal from an $S_1[n]$ signal and an $S_2[n]$ signal according to the present invention.

Please refer to FIG. 2, which is a schematic diagram demonstrating how the method 100 synthesizes the $S_3[n]$ signal from the $S_1[n]$ and $S_2[n]$ signals according to the present invention. In FIG. 2, a first part 401 shows the $S_1[n]$ and $S_2[n]$ signals in the step 102 of the method 100, a second part 402 shows the $S_1[n]$ and $S_5[n]$ signals calculated from the step 104 of the method 100, a third part 403 shows the maximum index $\tau_{max}$ the $S_4[n]$ signal calculated from the step 106 of the method 100, a fourth part 404 and a fifth part 405 the $S_3[n]$ signal synthesized from the $S_1[n]$ and the $S_4[n]$ signals in the step 108 of the method 100.

The $S_3[n]$ signal shown in the fourth part 404 of FIG. 2 is equal to $$\frac{(N_1 - th_2 - n)}{(N_1 - (\Delta + \tau_{\max} + th_1 + th_2))} * S_1[n] + \frac{n - (\Delta + th_1 + \tau_{\max})}{(N_1 - (\Delta + \tau_{\max} + th_1 + th_2))} * S_4[n - (\Delta + \tau_{\max},$$

where (the predetermined number Δ+the maximum index $\tau_{max}$+the first threshold value $th_1$)<=n<($N_1$ the second threshold value $th_2$).

The $S_3[n]$ signal shown in the fourth part 405 of FIG. 2 is equal to $$\frac{(N_1 - n)}{(N_1 - (\Delta + \tau_{\max}))} * S_1[n] + \frac{n - (\Delta + \tau_{\max})}{(N_1 - (\Delta + \tau_{\max}))} * S_4[n - (\Delta + \tau_{\max},$$

where (the predetermined number Δ+the maximum index $\tau_{max}$+the first threshold value $th_1$)<=n<($N_1$ the second value $th_2$).

Figure 3:
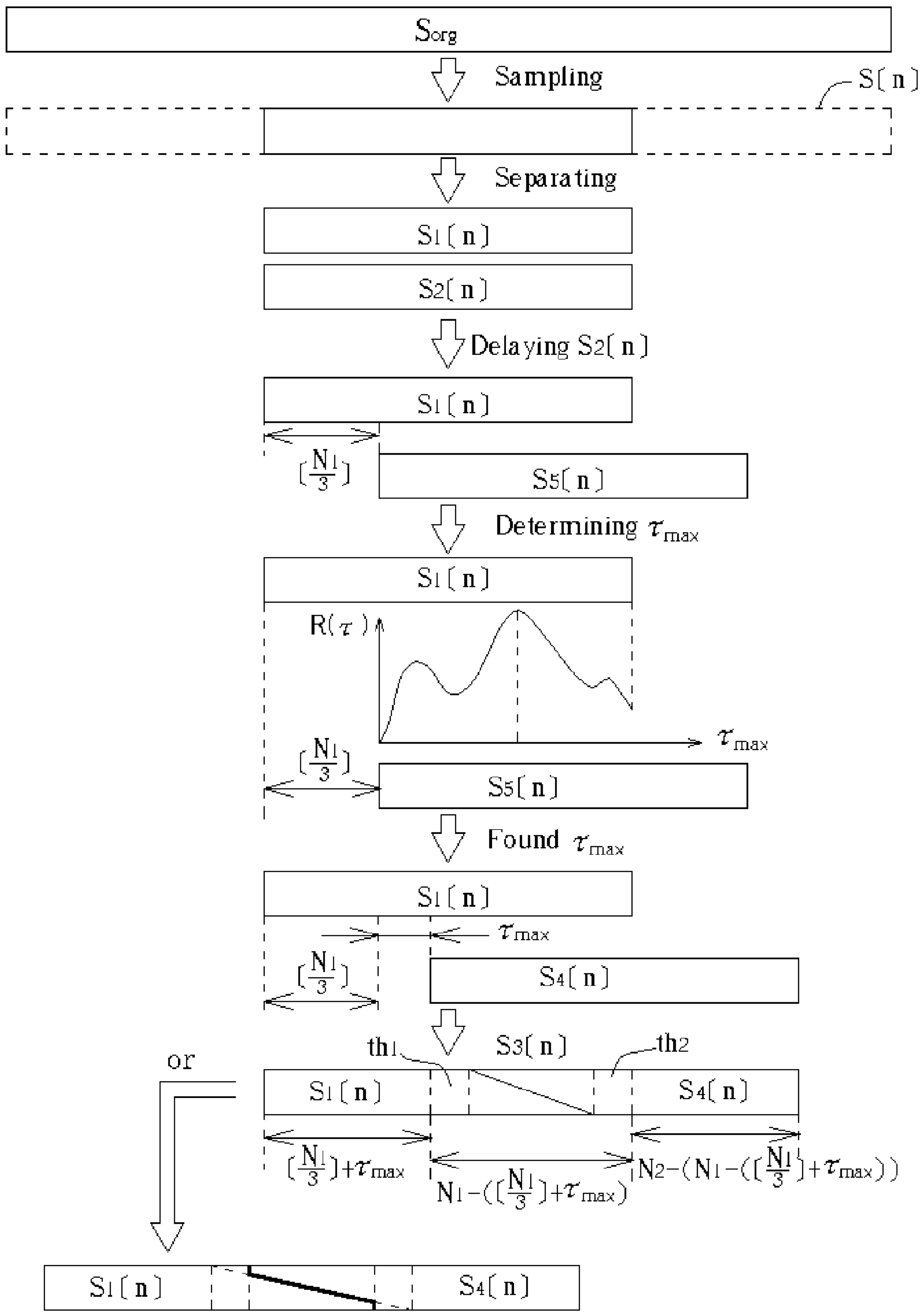
FIG. 3 is a schematic diagram demonstrating how the method elongates an audio signal according to the present invention.
Figure 4:
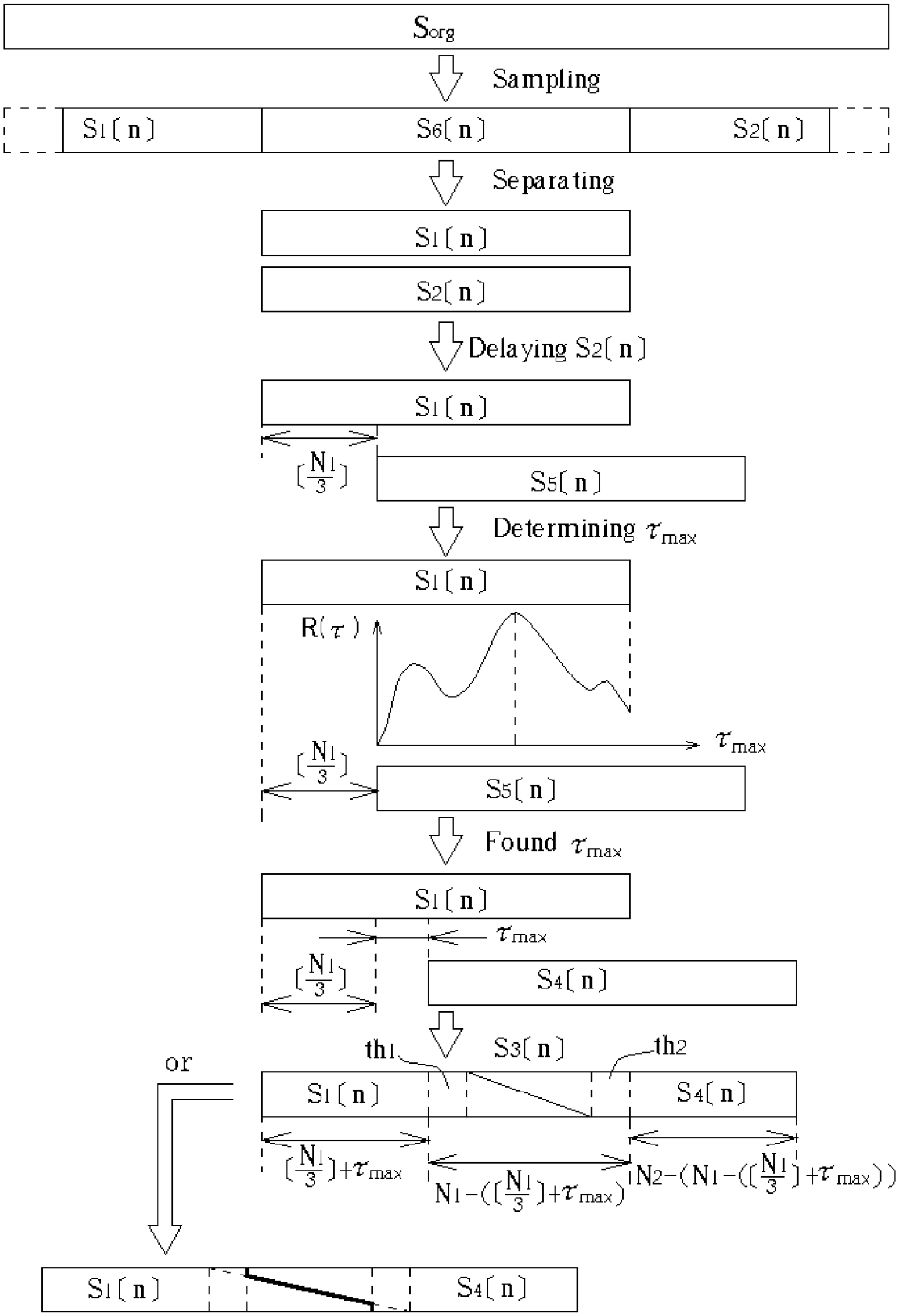
FIG. 4 is a schematic diagram demonstrating how the method shortens an audio signal according to the present invention.

If the $S_1[n]$ signal is the same as the $S_2[n]$ signal and both are derived from the S[n] at an identical region, as shown on FIG. 3, the method 100 in fact elongates the $S_1[n]$. On the contrary, if the $S_1[n]$ signal and the $S_2[n]$ signals are different from each other and are derived from the S[n] at two distinct regions respectively, as shown in FIG. 4, the method 100 in fact shortens the $S_1[n]$, an $S_6[n]$ (discarded) and the $S_2[n]$ signals into the $S_3[n]$ signal.

In contrast to the prior art, the present invention can provide a method to synthesize the $S_3[n]$ signal from the $S_1[n]$ and $S_2[n]$ signals based on the maximum index corresponding to the maximum magnitude of the autocorrelogram and the first and second threshold values for confining the overlapped signal simultaneously mixed with the $S_1[n]$ and the $S_2[n]$ signals. Instead of calculating all values of the overlapped signal from A to Z, the method calculates values between the first threshold and the second threshold to save time for a DSP chip to synthesize the $S_3[n]$ signal from the $S_1[n]$ and $S_2[n]$ signals and promote a computer where the DSP chip is installed in.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. A nonlinear overlap method for time scaling to synthesize an $S_3[n]$ signal from an $S_1[n]$ signal and an $S_2[n]$ signal, the $S_1[n]$ signal having $N_1$ elements and the $S_2[n]$ signal having $N_2$ elements, the method comprising:

(a) delaying the $S_2[n]$ signal by a predetermined number of elements and forming an $S_5[n]$ signal;

(b) establishing a cross-correlogram of a cross-correlation function of the $S_1[n]$ signal and the $S_5[n]$ signal, the cross-correlogram including a plurality of magnitudes, each of the magnitudes corresponding to an index; and (c) setting the $S_3[n]$ signal as values of the elements of:

$S_1[n]$, where 0<=n<(the predetermined number+a first threshold value+a maximum index), the maximum index corresponding a largest magnitude among all of the magnitudes of the cross-corrolegram;

$S_1[n]$ weighted and added to an $S_4[n]$ signal that lags the $S_5[n]$ signal by the maximum index, where (the predetermined number+the first threshold value+the maximum index)<=n<($N_1$ a second threshold value); and $S_4$[n−(the predetermined number+the maximum index)], where ($N_1$−the second threshold value)<=n<=($N_2$+the predetermined number+the maximum index);

wherein the first and second threshold values are not equal to zero at the same time.

2. The method of claim 1 wherein the $S_3[n]$ signal is equal to ($N_1$−the second threshold value−n)/($N_1$−(the predetermined number+the maximum index+the first threshold value+the second threshold value))*$S_1[n]$+(n−(the predetermined number+the maximum index+the first threshold value))/($N_1$−(the predetermined number+the maximum index+the first threshold value+the second threshold value))*$S_4$[n−(the predetermined number+the maximum index)] while (the predetermined number+the maximum index+the first threshold value)<=n<($N_1$−the second threshold value).

3. The method of claim 1 wherein the $S_3$[n] signal is equal to ($N_1$−n)/($N_1$−(the predetermined number+the maximum index))*$S_1$[n]+(n−(the predetermined number+the maximum index))/($N_1$−(the predetermined number+the maximum index))*$S_4$[n−(the predetermined number+the maximum index)].

4. The method of claim 1 wherein the $S_1$[n] signal and the $S_2$[n] signal are sampled from an $S_1$(t) signal and an $S_2$(t) signal respectively.

5. The method of claim 4 wherein the $S_1$(t) signal and the $S_2$(t) signal are both derived from an original signal.

6. The method of claim 5 wherein the original signal is an audio signal.

7. The method of claim 5 wherein the original signal is a video signal.

8. The method of claim 4 wherein the $S_1$(t) signal and the $S_2$(t) signal are identical.

9. The method of claim 4 wherein the $S_1$(t) signal and the $S_2$(t) signal are different from each other.

10. The method of claim 1 wherein the predetermined number is equal to [$N_1$/3].

11. A nonlinear overlap method for time scaling to synthesize an $S_3$[n] signal from an $S_1$[n] signal and an $S_2$[n] signal, the $S_1$[n] signal having $N_1$ elements and the $S_2$[n] signal having $N_2$ elements, the method comprising:

(a) establishing a cross-correlogram of a cross-correlation function of the $S_1$[n] signal and the $S_2$[n] signal, the cross-correlogram including a plurality of magnitudes, each of the magnitudes corresponding to an index; and (b) setting the $S_3$[n] signal as values of the elements of:

$S_1$[n], where 0<=n<(a first threshold value+a maximum index), the maximum index corresponding a largest magnitude among all of the magnitudes of the cross-corrolegram;

$S_1$[n] weighted and added to an $S_4$[n] signal that lags the $S_2$[n] signal by the maximum index, where (the first threshold value+the maximum index)<=n<($N_1$−a second threshold value); and $S_4$[n−the maximum index], where ($N_1$−the second threshold value)<=n<=($N_2$+the maximum index);

wherein the first and second threshold values are not equal to zero at the same time.

12. The method of claim 11 wherein the $S_3$[n] signal is equal to ($N_1$−the second threshold value−n)/($N_1$−(the maximum index+the first threshold value+the second threshold value))*$S_1$[n]+(n−(the maximum index+the first threshold vlaue))/($N_1$−(the maximum index+the first threshold value+the second threshold value))*$S_4$[n−(the maximum index)] while (the maximum index+the first threshold value)<=n<(N−the second threshold value).

13. The method of claim 11 wherein the $S_3$[n] signal is equal to ($N_1$−n)/($N_1$−the maximum index)*$S_1$[n]+(n−the maximum index)/(N−the maximum index)*$S_4$[n−the maximum index].

14. The method of claim 11 wherein the $S_1$[n] signal and the $S_2$[n] signal are sampled from an $S_1$(t) signal and an $S_2$(t) signal respectively.

15. The method of claim 14 wherein the $S_1$(t) signal and the $S_2$(t) signal are both derived from an original signal.

16. The method of claim 15 wherein the original signal is an audio signal.

17. The method of claim 15 wherein the original signal is a video signal.

18. The method of claim 14 wherein the $S_1$(t) signal and the $S_2$(t) signal are identical.

19. The method of claim 14 wherein the $S_1$(t) signal and the $S_2$(t) signal are different from each other.

* * * * *